(12) United States Patent  
Bertness

(10) Patent No.: US 6,359,441 B1  
(45) Date of Patent: Mar. 19, 2002

(54) ELECTRONIC BATTERY TESTER

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/560,920

(22) Filed: Apr. 28, 2000

Related U.S. Application Data

(60) Provisional application No. 60/132,045, filed on Apr. 30, 1999.

(51) Int. Cl.$^7$ ............................................. G01N 27/416

(52) U.S. Cl. ...................................... 324/426; 324/433

(58) Field of Search ................................ 324/426, 430; 320/132, 155, 134; 702/63

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |

(List continued on next page.)

OTHER PUBLICATIONS

"Electromechical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

(List continued on next page.)

*Primary Examiner*—Gregory Toatley  
(74) *Attorney, Agent, or Firm*—Westman, Champlin & Kelly, P.A.

(57) ABSTRACT

An electronic battery tester for determining a condition of a storage battery includes a forcing function adapted to couple to the battery. Circuitry coupled to the forcing function is adapted to obtain measurements from the battery at multiple levels of the forcing function. In the method according to the present invention, a forcing function is applied to the battery at a first level and a first measurement is obtained. The forcing function is applied at a second level and a second measurement is obtained. The first and second measurements are correlated to condition of the battery.

22 Claims, 3 Drawing Sheets

U.S. PATENT DOCUMENTS

| | | | |
|---|---|---|---|
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,363,407 A | 12/1982 | Barkler et al. | 209/3.3 |
| 4,369,407 A | 1/1983 | Korbell | 324/416 |
| 4,379,990 A | 4/1983 | Sievers et al. | 322/99 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,633,418 A | 12/1986 | Bishop | 364/554 |
| 4,659,977 A | 4/1987 | Kissel et al. | 320/64 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin et al. | 324/436 |
| 4,849,700 A | 7/1989 | Morioka et al. | 324/427 |
| 4,876,495 A | 10/1989 | Palanisamy et al. | |
| 4,881,038 A | 11/1989 | Champlin | 324/426 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavvvvey et al. | 320/14 |
| 4,968,941 A | 11/1990 | Rogers | 324/428 |
| 4,968,942 A | 11/1990 | Palanisamy | |
| 5,004,979 A | 4/1991 | Marino et al. | 324/160 |
| 5,032,825 A | 7/1991 | Xuznicki | 340/636 |
| 5,047,722 A | 9/1991 | Wurst et al. | 324/430 |
| 5,087,881 A | 2/1992 | Peacock | 324/378 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,442,274 A | 8/1995 | Tamai | 320/23 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,717,336 A | 2/1998 | Basell et al. | 324/430 |
| 5,717,937 A | 2/1998 | Fritz | 395/750.01 |
| 5,747,909 A | 5/1998 | Syverson et al. | 310/156 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,808,469 A | 9/1998 | Kopera | 324/43.4 |
| 5,821,756 A | 10/1998 | McShane et al. | 324/430 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |

| | | | |
|---|---|---|---|
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,150,793 A | 11/2000 | Lesesky et al. | 320/104 |
| 6,163,156 A | 12/2000 | Bertness | 324/426 |
| 6,172,483 B1 | 1/2001 | Champlin | 320/134 |
| 6,172,505 B1 | 1/2001 | Bertness | 324/430 |

FOREIGN PATENT DOCUMENTS

| | | |
|---|---|---|
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| WO | WO 93/22666 | 11/1993 |
| WO | WO 98/58270 | 12/1998 |

OTHER PUBLICATIONS

"A Look at the Impedance of a Cell", by S. Debardelaben, *IEEE,* 1988, pp. 394–397.

"The Impedance of Electrical Storage Cells", by N.A. Hampson et al., *Journal of Applied Electrochemistry,* 1980, pp. 3–11.

"A Package for Impedance/Admittance Data Analysis", by B. Boukamp, *Solid State Ionics,* 1986, pp. 136–140.

"Precision of Impedance Spectroscopy Estimates of Bulk, Reaction Rate, and Diffusion Parameters", by J. Macdonald et al., *J. Electroanal, Chem.,* 1991, pp. 1–11.

Internal Resistance: Harbinger of Capacity Loss in Starved Electrolyte Sealed Lead Acid Batteries, , pp. by Vaccaro, F.J. et al., *AT& T Bell Laboratories,* 1987 IEEE, Ch. 2477 128, 131.

IEEE Recommended Practice for Maintenance, Testings, and Replacement of Large Lead Storage Batteries for Generating Stations and Substations, *The Institute of Electrical and Electronics Engineers, Inc.,* ANSI/IEEE Std. 450–1987, Mar. 9, 1987, pp. 7–15.

"Field and Laboratory Studies to Assess the State of Health of Valve–Regulated Lead Acid Batteries: Part 1 Conductance/Capacity Correlation Studies", by D. Feder et al., *IEEE,* Aug. 1992, pp. 218–233.

"JIS Japanese Industrial Standard–Lead Acid Batteries for Automobiles", *Japanese Standards Association UDC,* 621.355.2:629.113.006, Nov. 1995.

"Performance of Dry Cells", by C. Hambuechen, Preprint of *Am. Electrochem. Soc.,* Apr. 18–20, 1912, paper No. 19, pp. 1–5.

"A Bridge for Measuring Storage Battery Resistance", by E. Willihncanz, *The Electrochemical Society,* preprint 79–20, Apr. 1941, pp. 253–258.

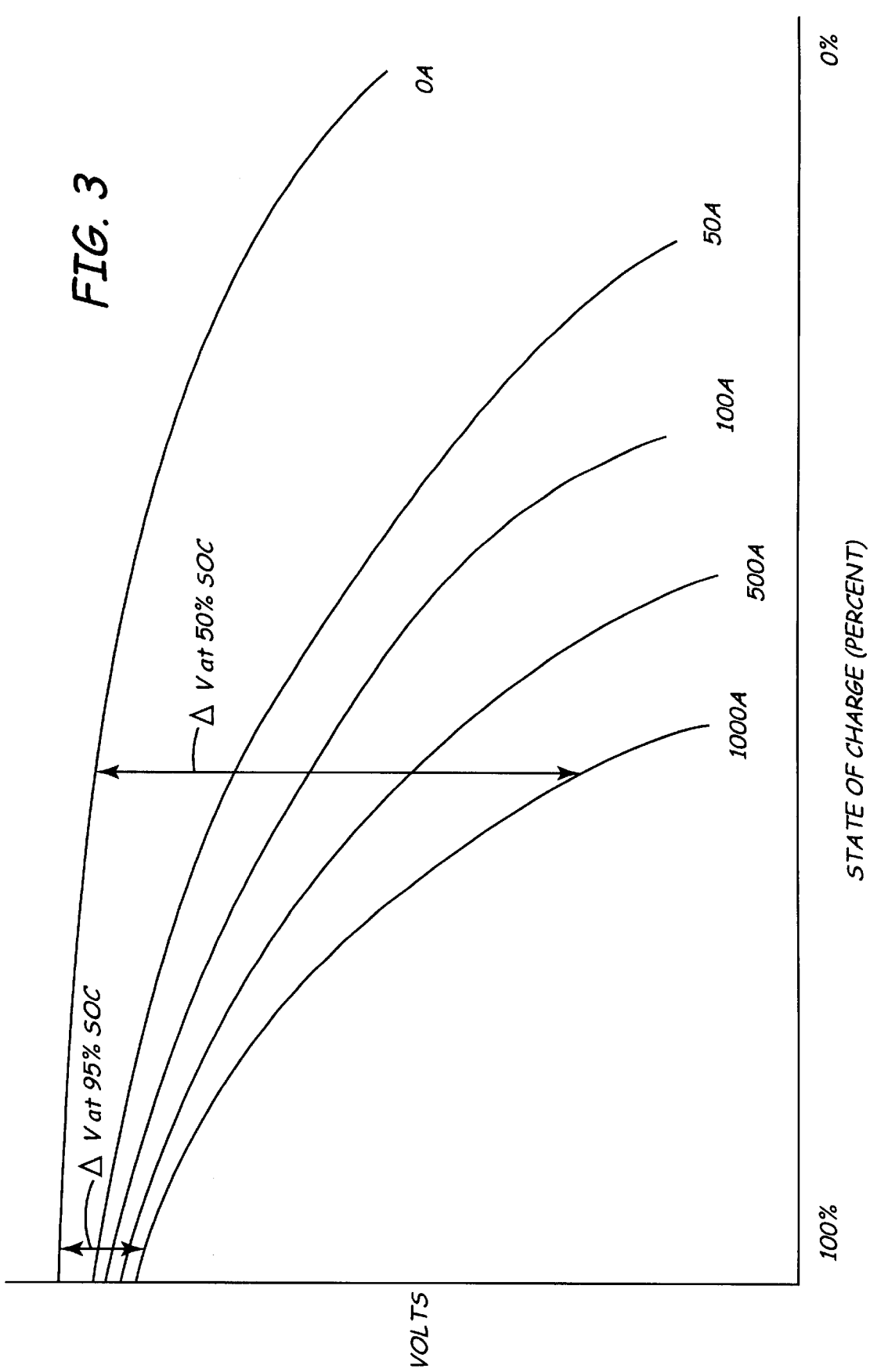

US 6,359,441 B1

ELECTRONIC BATTERY TESTER

The present invention claims priority to Provisional Application Ser. No. 60/132,045, filed Apr. 30, 1999, and entitled ELECTRONIC BATTERY TESTER.

BACKGROUND OF THE INVENTION

The present invention relates to testing of storage batteries. More specifically, the present invention relates to testing storage batteries using conductance, impedance, resistance, admittance or their combination.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; and U.S. Pat. No. 5,831,435, issued Nov. 3, 1998, entitled BATTERY TESTER FOR JIS STANDARD.

However, there is an ongoing need to improve battery testing techniques and derive additional information about the battery using non-invasive electrical means.

SUMMARY OF THE INVENTION

An electronic battery tester for determining a condition of a storage battery includes a forcing function adapted to couple to the battery. Circuitry coupled to the forcing function is adapted to obtain measurements from the battery at multiple levels of the forcing function. In the method according to the present invention, a forcing function is applied to the battery at a first level and a first measurement is obtained. The forcing function is applied at a second level and a second measurement is obtained. The first and second measurements are correlated to condition of the battery.

BRIEF DESCRIPTION OF THE DRAWINGS

FIG. 3 is a graph of change in voltage versus state of charge (percent) for various values of differential current.

DETAILED DESCRIPTION OF THE PREFERRED EMBODIMENTS

Figure 1:
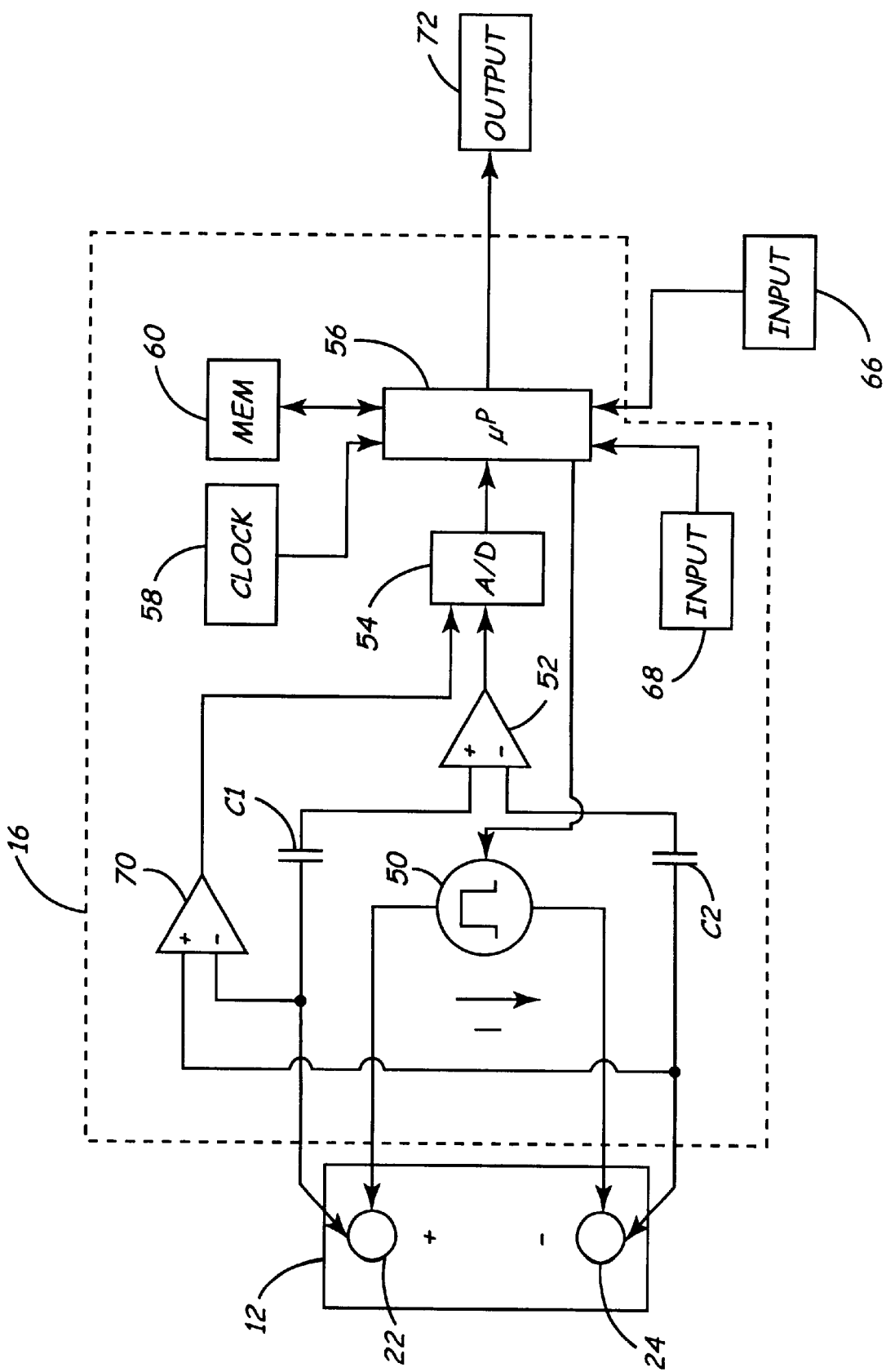
FIG. 1 is a simplified block diagram of a battery tester in accordance with the present invention.

FIG. 1 is a simplified block diagram of battery monitoring circuitry 16 in accordance with the present invention. Apparatus 16 is shown coupled to battery 12 which includes a positive battery terminal 22 and a negative battery terminal 24.

In a preferred embodiment, circuitry 16 operates, with the exceptions and additions as discussed below, in accordance with battery testing methods described in one or more of the United States patents obtained by Dr. Champlin and Midtronics, Inc. and listed above. Circuitry 16 operates in accordance with one embodiment of the present invention and determines the conductance ($G_{BAT}$) of battery 12 and the voltage potential ($V_{BAT}$) between terminals 22 and 24 of battery 12. Circuitry 16 includes current source 50, differential amplifier 52, analog-to-digital converter 54 and microprocessor 56. Current source 50 provides one example of an adjustable forcing function for use with the invention.

Amplifier 52 is capacitively coupled to battery 12 through capacitors $C_1$, and $C_2$. Amplifier 52 has an output connected to an input of analog-to-digital converter 54. Microprocessor 56 is connected to system clock 58, memory 60, and analog-to-digital converter 54. Microprocessor 56 is also capable of receiving an input from input devices 66 and 68. Microprocessor 56 also connects to output device 72.

In operation, current source 50 is controlled by microprocessor 56 and provides a current I in the direction shown by the arrow in FIG. 1. Microprocessor 56 also controls the level (i.e., peak to peak, RMS, etc.) of the time varying component of the forcing function. In one embodiment, this is a sine wave, square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24 and is one example of a dynamic response sensor used to sense the time varying response of the battery 18 to the applied time varying forcing function. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. This measurement provides a dynamic parameter related to the battery. Of course, any such dynamic parameter can be measured including resistance, admittance, impedance or their combination along with conductance. Further, any type of time varying signal can be used to obtain the dynamic parameter. The signal can be generated using an active forcing function or using a forcing function which provides a switchable load, for example, coupled to the battery 12. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the conductance of battery 12 using the following equation:

$$\text{Conductance} = G_{BAT} = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$. Based upon the battery conductance $G_{BAT}$ and the battery voltage, the battery tester 16 determines the condition of battery 12. Battery tester 16 is programmed with information which can be used with the determined battery conductance and voltage as taught in the above listed patents to Dr. Champlin and Midtronics, Inc.

The tester can compare the measured CCA (Cold Cranking Amp) with the rated CCA for that particular battery. Microprocessor 56 can also use information input from input device 66 provided by, for example, an operator. This information may consist of the particular type of battery, location, time, the name of the operator. Additional information relating to the conditions of the battery test can be received by microprocessor 56 from input device 68. Input device 68 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test how the battery test was performed, or intermediate results obtained in conducting the test. Additional test condition information is provided by microprocessor 56. Such additional test condition information may include the values of $G_{BAT}$ and battery voltage, the various inputs provided to battery tester 16 by the operator which may include, for example, type of battery, estimated ambient or battery temperature, type of vehicle (i.e., such as provided through the Vehicle Identification Number (VIN) code for the vehicle) or the particular sequence of steps taken by the operator in conducting the test.

Typically, in prior art battery testers, current source 50 applied a fixed current through application of a small fixed load. However, one aspect of the present invention includes the recognition that the conductance, impedance, resistance or admittance measurements obtained using the aforementioned techniques can, in some instances, change depending upon the size of current I used in obtaining the measurement. This change can be correlated, either experimentally or through modeling techniques, to characteristics related to the condition of battery 12. Thus, microprocessor 56 obtains a number of data points and uses those data points to determine condition information of battery 12.

Although the embodiment illustrated in FIG. 1 shows a current source 50, element number 50 can be viewed as a forcing function and can be either an applied current, an applied load or an implied voltage. Typically, in prior art (non-load testers) the current I has been about 0.25 amp or the applied resistance has been about 50 ohms.

In accordance with the present invention, a first forcing function is applied and the resulting change in current or voltage from battery 12 is measured by microprocessor 56 to determine a first data point (conductance, impedance, resistance, admittance, or their combination). Additional data points are then obtained, for example, by varying the forcing function a small amount, such as less than 10%. Other data points can be obtained by varying the forcing function from between about 10% to about 50%. Yet further information can be obtained by changing the forcing function by between 50% to about 100%, or greater than 100% such as orders of magnitude greater than the original forcing function. Note that these ranges are simply examples and other ranges can be used in accordance with the present invention. Further, any number of data points can be collected within a particular range, or spanning different ranges if desired and as determined based upon experimentation. The particular percentages chosen are simply examples and the invention is not limited to these values. In the broad sense, this aspect of the invention relates to comparing data measurements obtained at different forcing function levels and the particular forcing function levels and their relationship to each other is not significant. However, in a more narrow aspect of the invention, the particular relationship between the various forcing functions is significant and can be used in determining the condition of the battery.

In another aspect of the present invention, the forcing function is not varied, instead, a relatively high current level of between about 1 amp and about 100 amps is applied using a resistance of between 10 ohms and about 0.1 ohms. Similarly, a relatively low current level between about 0.1 amps and about 1 amp is applied using a resistance of between 100 ohms and about 10 ohms. (Note that typical prior art load testers draw a fixed current of about 100 to 200 amps using a fixed resistance of about 0.12 ohms and 0.06 ohms).

The microprocessor uses the collected data to determine the condition of the battery. This information is correlated to various physical attributes of the battery which can be determined experimentally. For example, the data can correlate to temperature, state of charge, grid corrosion, loss of active material, sulfation, specific gravity, metallic degradation, polarization or stratification of battery 12. These or other determinations can be made based upon the measurements made at the different forcing function levels or through the use of a single measurement obtained at a high or low forcing function level.

In yet another aspect of the present invention, measurement information using one measurement technique (conductance, impedance, resistance, admittance, or their combination) is used and correlated with measurement information obtained using a second measurement technique (conductance, impedance, resistance, admittance or their combination). This can be done at a single forcing function level or using the above described multiple level technique. The data from the different techniques can correlate to the condition of the battery. Further, more than two techniques can be used in such a task.

Figure 2:
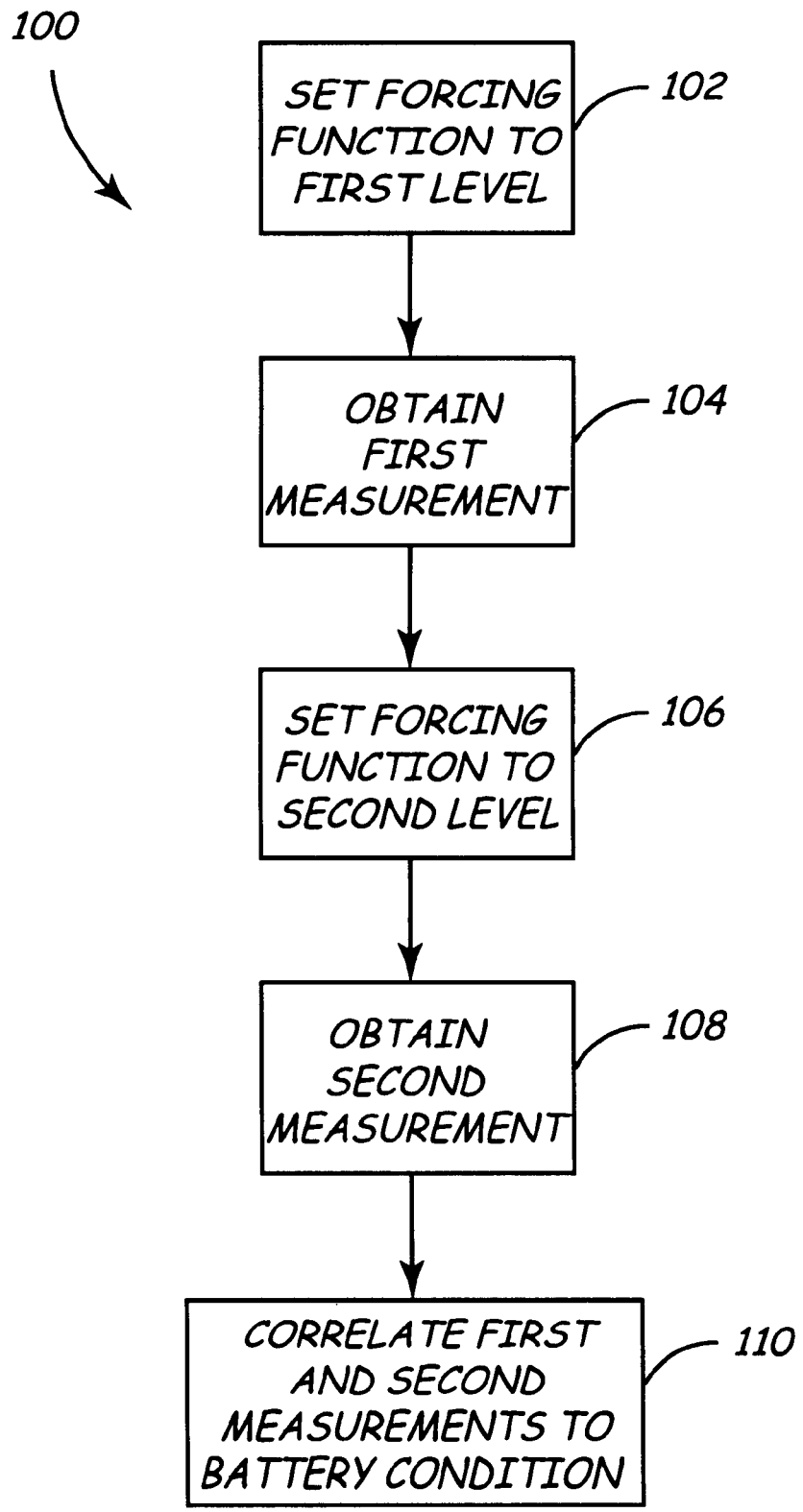
FIG. 2 is a simplified flow chart showing steps in accordance with one embodiment of the present invention.

FIG. 2 is a simplified flow chart 100 showing steps in accordance with one aspect of the present invention. At 102, the forcing function is set to a first level. At 104, a first measurement is obtained. At 106, the forcing function is set to a second level and a second measurement is obtained at 108. At 110, microprocessor 56 correlates the first and second measurements to a condition of the battery and, for example, provides an output on output 72 to an operator. As described above, more than two different forcing function levels can be used in the present invention.

FIG. 3 is an example of a graph of differential voltage versus state of charge for various differential currents applied to battery 12, where the differential current levels have values of 0 Amps, 50 Amps, 100 Amps, 500 Amps and 1000 Amps. As illustrated in FIG. 3, the resultant differential voltage $\Delta V$ is different for differing states of charge. FIG. 3 also illustrates that the ratio of $\Delta I/\Delta V$ changes as a function of $\Delta I$. This change in $\Delta I/\Delta V$, for various values of $\Delta I$, can be correlated to other parameters which relate to battery 12.

The terms "inject" or "apply" is used herein to describe the supply of voltage or current either with active circuitry or by applying load to the battery. Further, the applied signals can be time varying signals such as step functions, pulse signals, periodic signals, etc.

The present invention may be implemented using any appropriate technique. For simplicity, a single technique has been illustrate herein. However, other techniques may be used including implementation in all analog circuitry.

Additionally, by using appropriate techniques, the battery resistance and a reference resistance (the reciprocal of conductance) may be employed in the invention.

Although the present invention has been described with reference to preferred embodiments, workers skilled in the art will recognize that changes may be made in form and detail without departing from the spirit and scope of the invention. The present invention can be used with conductance, resistance, impedance, admittance or their combination in performing the battery test.

What is claimed is:

1. An electronic battery tester for determining condition of the storage battery, comprising:

a four point Kelvin connection adapted to electrically couple to the terminals of the battery;

an adjustable forcing function having a forcing function output with a time varying component having an adjustable level in response to an adjustment input, the forcing function output coupled to a first pair of connections of the Kelvin connection;

a dynamic response sensor coupled to a second pair of connections of the Kelvin connection configured to provide a sensed output related to a time varying response of the battery to the forcing function;

digital circuitry coupled to the forcing function and the dynamic response sensor configured to provide the adjustment input to the forcing function whereby the forcing function output level is changed between a plurality of different levels, the digital circuitry configured to measure a dynamic parameter of the battery as a function of the sensed output at a plurality of different forcing function levels.

2. The apparatus of claim 1 wherein the digital circuitry is configured to correlate the dynamic parameters to a condition of the battery.

3. The apparatus of claim 2 wherein the condition comprises state of charge of the battery.

4. The apparatus of claim 1 wherein the adjustable forcing function comprises a load.

5. The apparatus of claim 1 wherein the adjustable forcing function comprises a current sink.

6. The apparatus of claim 1 wherein the dynamic response sensor is configured to sense a voltage having a time varying component.

7. The apparatus of claim 6 wherein the dynamic response sensor includes a differential amplifier.

8. The apparatus of claim 1 including an analog to digital converter configured to provide a digital representation of the sensed output to the digital circuitry.

9. The apparatus of claim 1 wherein the digital circuitry comprises a microprocessor.

10. The apparatus of claim 1 wherein the forcing function output comprises a square wave.

11. The apparatus of claim 1 wherein the dynamic parameter of the battery comprises conductance.

12. The apparatus of claim 1 wherein the dynamic parameter of the battery is selected from the group consisting of resistance, admittance and impedance.

13. A method of testing a battery, comprising:

applying a forcing function having a time varying component at a first level to the battery through a first pair of connections of a Kelvin connection;

obtaining a first dynamic response measurement through a second pair of connections of the Kelvin connection related to a response of the battery to the applied forcing function;

applying the forcing function having a time varying component at a second level to the battery through the first pair of connections of a Kelvin connection;

obtaining a second dynamic response measurement through the second pair of connections of the Kelvin connection related to a response of the battery to the applied forcing function; and correlating the first and second dynamic response measurements to a condition of the battery.

14. The method of claim 13 wherein applying the forcing function comprises applying a load to the battery.

15. The method of claim 13 wherein obtaining the first and second dynamic response measurements comprises measuring dynamic voltages of the battery.

16. The method of claim 13 wherein correlating the first and second dynamic response measurements include determining a dynamic parameter of the battery as a function of the applied forcing functions and dynamic response measurements.

17. The method of claim 16 wherein the dynamic parameter comprises conductance.

18. The method of claim 16 wherein the dynamic parameter is selected from the group consisting of resistance, impedance and admittance.

19. The method of claim 13 wherein the condition of the battery comprises state of charge of the battery.

20. The method of claim 13 wherein the forcing function comprises a square wave.

21. The apparatus of claim 1 wherein the adjustable level comprises at least two current levels.

22. The method of claim 13 wherein the first and second levels of the forcing function comprise first and second current levels.

* * * * *

UNITED STATES PATENT AND TRADEMARK OFFICE
CERTIFICATE OF CORRECTION

PATENT NO.   : 6,359,441 B1
DATED        : March 19, 2002
INVENTOR(S)  : Kevin I. Bertness It is certified that error appears in the above-identified patent and that said Letters Patent is hereby corrected as shown below:

Title page,
Item [56], References Cited, OTHER PUBLICATIONS, add the following:
-- "Battery Impedance", by E. Willihnganz et al., Electrical Engineering, September 1959, pp. 922-925. --

Signed and Sealed this

Twenty-fourth Day of August, 2004

JON W. DUDAS
*Director of the United States Patent and Trademark Office*